(12) United States Patent
Singh et al.

(10) Patent No.: US 9,093,501 B2
(45) Date of Patent: *Jul. 28, 2015

(54) INTERCONNECTION WIRES OF SEMICONDUCTOR DEVICES

(71) Applicant: Taiwan Semiconductor Manufacturing Company, Ltd., Hsin-Chu (TW)

(72) Inventors: Sunil Kumar Singh, Mirzapur (IN); Hsin-Chieh Yao, Hsinchu (TW); Chung-Ju Lee, Hsinchu (TW); Hsiang-Huan Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/322,330

(22) Filed: Jul. 2, 2014

(65) Prior Publication Data
US 2014/0315382 A1  Oct. 23, 2014

Related U.S. Application Data

(63) Continuation of application No. 13/724,737, filed on Dec. 21, 2012, now Pat. No. 8,778,794.

(51) Int. Cl.
| H01L 21/4763 | (2006.01) |
| H01L 21/768 | (2006.01) |
| H01L 23/538 | (2006.01) |
| H01L 21/48 | (2006.01) |
| H01L 23/532 | (2006.01) |
| H01L 23/528 | (2006.01) |

(52) U.S. Cl.
CPC ........ *H01L 21/76843* (2013.01); *H01L 21/486* (2013.01); *H01L 21/76801* (2013.01); *H01L 21/76804* (2013.01); *H01L 21/76808* (2013.01); *H01L 21/76837* (2013.01); *H01L 21/76852* (2013.01); *H01L 21/76883* (2013.01); *H01L 21/76885* (2013.01); *H01L 23/5283* (2013.01); *H01L 23/538* (2013.01); *H01L 23/5329* (2013.01); *H01L 23/53238* (2013.01); *H01L 2924/0002* (2013.01)

(58) Field of Classification Search
CPC ................... H01L 21/76801; H01L 21/76804; H01L 21/76808; H01L 21/76837; H01L 23/53238
USPC ........................... 438/627, 643; 257/751, 758
See application file for complete search history.

(56) References Cited

U.S. PATENT DOCUMENTS

| 8,592,978 B2 | 11/2013 | Matsuno et al. | |
| 8,778,794 B1* | 7/2014 | Singh et al. | 438/627 |
| 2001/0051228 A1* | 12/2001 | Sugahara et al. | 427/489 |
| 2006/0270212 A1* | 11/2006 | Jung et al. | 438/622 |

* cited by examiner

Primary Examiner — Tu-Tu Ho
(74) Attorney, Agent, or Firm — Haynes and Boone, LLP

(57) ABSTRACT

A method of forming a semiconductor device includes forming a plurality of substantially equal-spaced first spacers having a first pitch over a substrate and forming first metal interconnecting wires utilizing the first spacers. The method also includes forming a plurality of substantially equal-spaced second spacers in such a way to abut, respectively, the plurality of first metal interconnecting wires and define a plurality of substantially equal-spaced trenches. A plurality of second metal interconnecting wires are disposed, respectively, within the trenches and the second spacers are removed, thereby defining a plurality of substantially equal-spaced channels.

20 Claims, 8 Drawing Sheets ated, they must be interconnected to form the desired electrical circuits. Traditionally, aluminum was the metal used for the interconnecting wire wherein films of aluminum are deposited, patterned, and then etched, leaving isolated wires. Dielectric material is then deposited over the exposed wires for insulation. The traditional insulating material was a form of silicon dioxides (SiO2) or a silicate glass. The various metal layers in a chip are interconnected by etching holes, called vias formed in the insulating material and filled with tungsten deposited therein by a CVD technique.

INTERCONNECTION WIRES OF SEMICONDUCTOR DEVICES

This is a continuation of U.S. Ser. No. 13/724,737 filed Dec. 21, 2012, the disclosure of which is herein incorporated by reference.

BACKGROUND

The semiconductor integrated circuit (IC) industry has experienced exponential growth. Technological advances in IC materials and design, and nanometer technology have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs, but also increased the complexity of processing and manufacturing ICs and casted challenges from both fabrication and design issues.

Generally, an integrated circuit (IC) manufacturing comprises largely a "data preparation stage" where an IC to be fabricated is designed to produce an IC layout, and a "fabrication stage," where the ICs are fabricated according to the designed layout in a fab house. The fabrication stage includes largely, a photomask generation, a wafer preparation, and a wafer processing, wafer test, die preparation, and packaging that ends up with a finished chip that comprises up to eleven metal levels in modern days. The wafer processing itself, which produces the desired semiconductor electronic elements on the wafer, comprises over 300 sequenced line of processes that are largely divided into a front-end of line processing such as deposition, removal, patterning, and ion doping, and a back-end of line processing such as creating metal interconnecting wires that are isolated by dielectric layers, Once the various semiconductor devices have been created, they must be interconnected to form the desired electrical circuits. Traditionally, aluminum was the metal used for the interconnecting wire wherein films of aluminum are deposited, patterned, and then etched, leaving isolated wires. Dielectric material is then deposited over the exposed wires for insulation. The traditional insulating material was a form of silicon dioxides (SiO2) or a silicate glass. The various metal layers in a chip are interconnected by etching holes, called vias formed in the insulating material and filled with tungsten deposited therein by a CVD technique.

Recently, however, as the number of interconnect levels for logic substantially increased due to the large number of transistors interconnected in a modern microprocessor, the timing delay in the wiring, represented by the time constant RC (R: resistance, C: capacitance), has become significant. The need to reduce RC prompted a change both in wiring material and in dielectric material. For wiring material, copper came to replace aluminum in higher performance processors for its lower value of R, so a greater conductivity, than aluminum. For dielectric material, the $SiO_2$ came to be replaced, for producing a greater C, by a new dielectric material having a low dielectric constant ("k"), such as SiOC (silicon oxycarbide) that has k around 2.7 as compared to 3.9 for $SiO_2$. These days, even materials with ultra-low k of 2.2, are being offered to chipmakers.

The interconnecting wires are formed after the creation of semiconductor devices, such as MOSFETs or DRAMs, by a series of usual processes such as patterning, deposition, and etching. But in the current fabrication methods practiced in the art, which use a couple of processes of etching, there is observed a problem that the low k material becomes damaged by the etching process. In many cases, the etching process changes the k to a higher value, thereby destroying the benefit of improved RC value and impairing the reliability of the performance expected from the use of the low k dielectrics.

Therefore, there is a need to provide a method for forming interconnecting wires in fabricating semiconductor device, using copper and low k dielectric materials, where the low k dielectric material is protected from damage due to etching processes to ensure improved interconnect time delay and reliability of performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
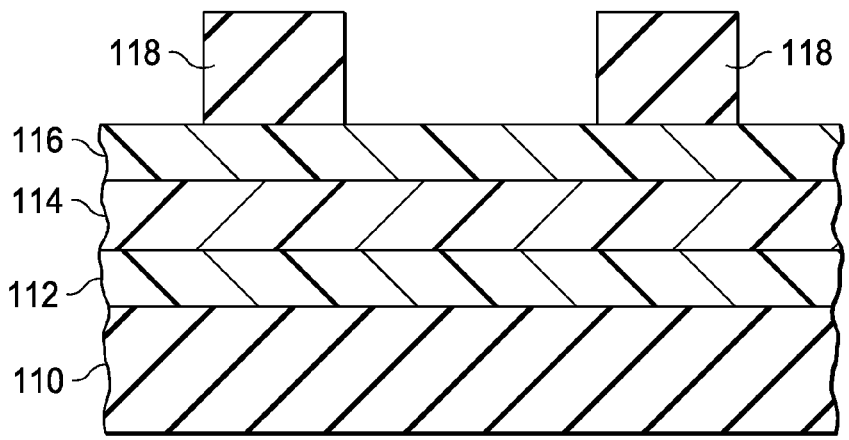
FIGS. 1(a)-(i) are schematic diagrams of steps typically performed in the prior art in a process for constructing interconnecting wires on a layer during the fabrication of semiconductor devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

The various aspects of the present disclosure involve a process for forming interconnecting wires during the fabrication of semiconductor devices such as MOSFETs, Fin-FETs, DRAMs, Microprocessors, . . . etc. The interconnecting wires are formed by copper ("Cu") deposition, etching, and a single spacer formation with an in-situ material such as $CH_2F_2$ plasma, while the low k dielectric material filled between the copper wires is not damaged, particularly from the etching, during the process of the present disclosure.

Typical modern semiconductor devices, such as microprocessors or CMOSs, have multiple layers of copper interconnections and insulations such as spin-on dielectrics (SOD), and interweaving etch stop layers. For patterning copper interconnections, the traditional techniques of photoresist masking and plasma etching, used for aluminum, cannot be used due to the lack of volatile copper compounds. Instead, a process known as a "Damascene" came to be used for copper. In that process, first, an underlying silicon oxide insulating layer is patterned with open trenches, which is then overfilled by a thick coating of copper deposited on the insulator. The copper above the level of the top of the insulating layer is removed by a chemical-mechanical planarization process (CMP) to leave trenches filled with copper in the insulating layer to function as conducting interconnections.

This Damascene process, however, has shortcomings especially when low k dielectric materials, which have many advantages over traditional $SiO_2$, are used for insulation. FIGS. 1(a)-(i), the schematic diagrams of steps typically performed in the prior art in a process for constructing interconnecting wires on a layer during the fabrication of semiconductor devices, demonstrate such shortcomings.

Figure 1B:
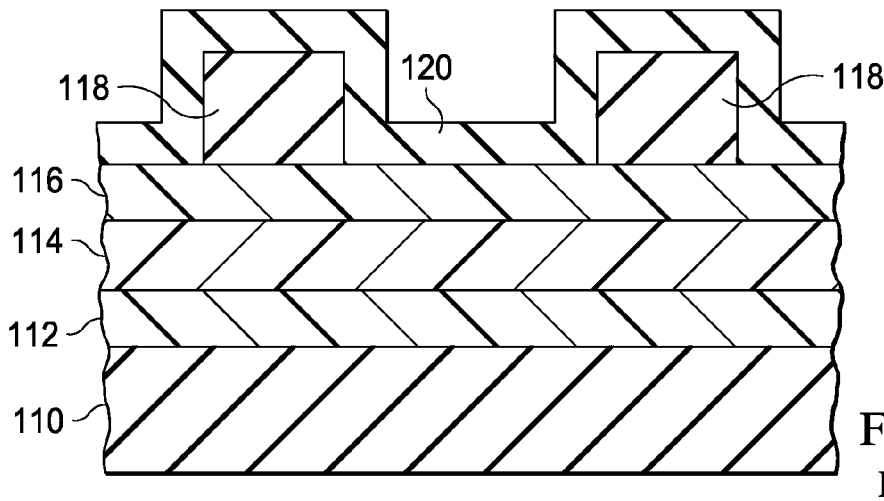
Figure 1C:
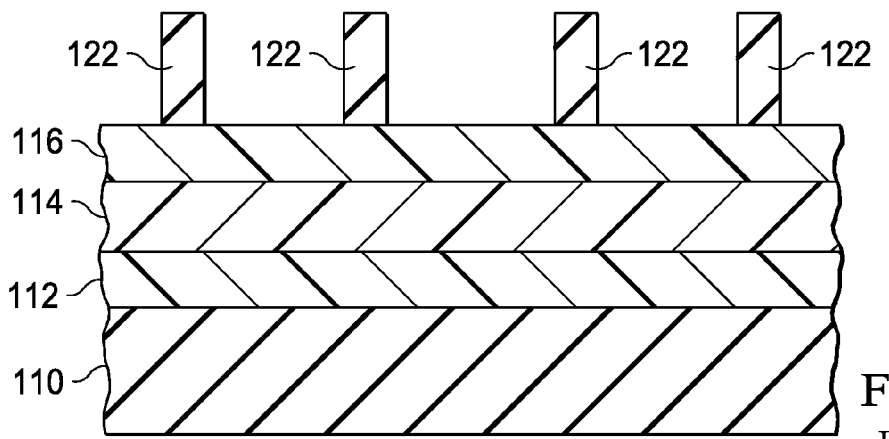
Figure 1D:
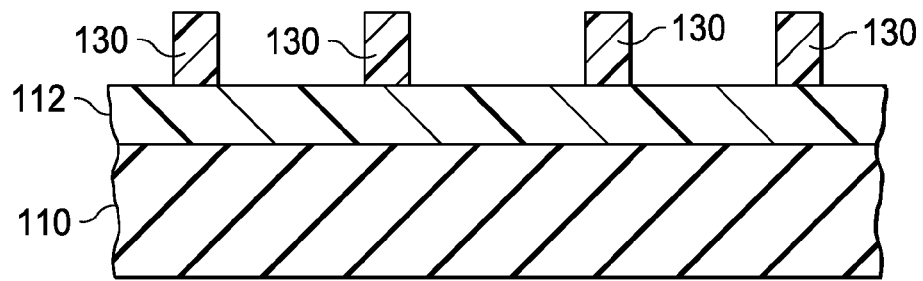

FIG. 1(a) shows a stack of layers comprising inter-level dielectric layer 110, two layers of hard masks 112 and 114, a layer of anti-reflective coding 116, and photoresist 118. Below the inter-level dielectric layer 110, there could be a layer of semiconductor devices that are finished with fabrication from a front-end-of line processing, or a finished layer of interconnections. The photoresist 118 shown has been already patterned through the processes of exposure and developing using a lithography. FIG. 1(b) shows a dielectric material 120, such as $SiO_2$, SiC, or $SiNi_4$, deposited upon the stack of layers to act as spacers between the interconnecting wires later on. FIG. 1(c) shows top and bottom portions of the dielectric material 120 removed by a suitable process, such as anisotropic etching, leaving wall portions 122 thereof. The photoresist 118 has been stripped off by an ashing process. FIG. 1(d) shows the stack of layers after having gone through another etching (BB2), by which the hard mask layer 114 and anti-reflective coding layer 116 have been etched off except for portions 130 of the hard mask layer 114, which were under the wall portions 122, and hence, protected from the etchant. The wall portions 122 shown in FIG. 1(c) have been subsequently removed by a suitable process such as another etching or a CMP (chemical mechanical planarization).

Figure 1E:
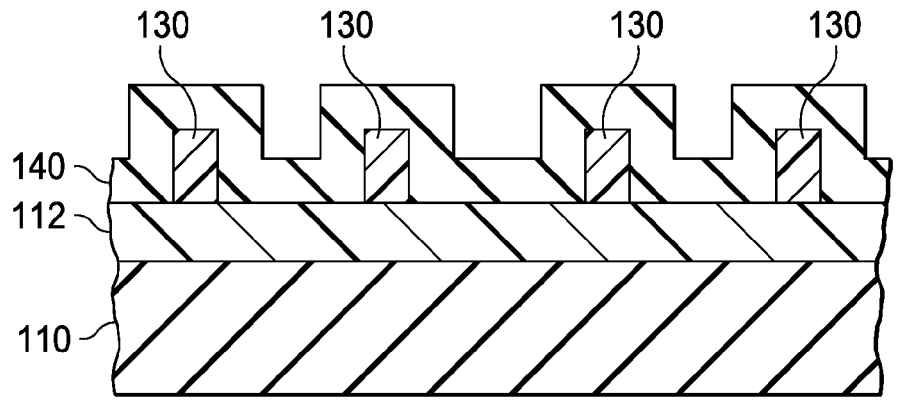
Figure 1F:
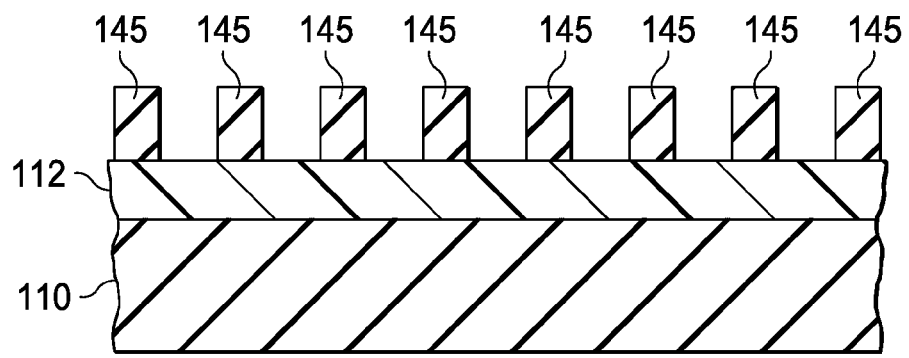
Figure 1G:
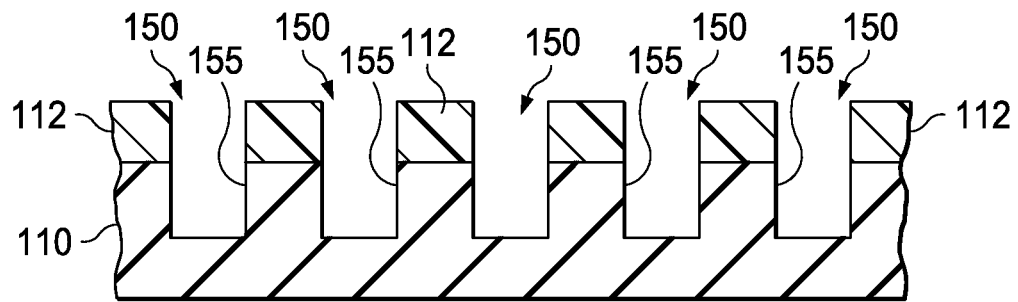
Figure 1H:
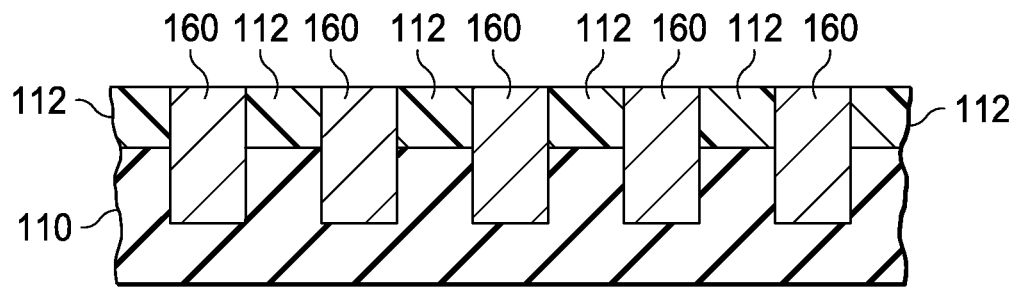
Figure 1I:
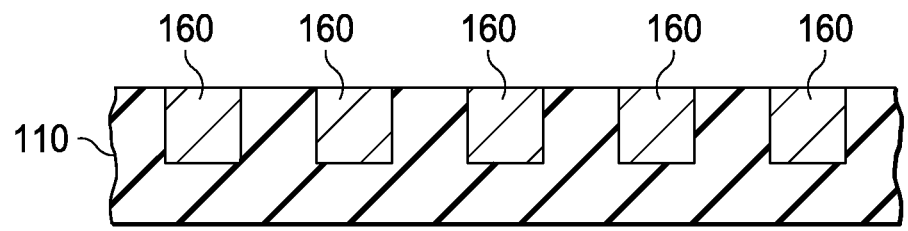

FIG. 1(e) shows another spacer material 140 having been deposited. FIG. 1(f) shows spacers 145 formed after the top and bottom portions of the spacer material 140 and the portions 130 in FIG. 1(e) are removed by another etching(s). FIG. 1(g) shows another etching having been performed to the inter-level dielectric layer 110, past the hard mask layer 112, and the masking spacers 145 having been removed. The portions of the inter-level dielectric layer 110 that are located directly under the spacers 145 and the second hard mask layer 112 in FIG. 1(f) will survive the etching and form insulating walls 155, and the rest of the inter-level dielectric layer 110 will be etched to form trenches 150. FIG. 1(h) shows metallic material 160 such as copper having been deposited upon to layers to fill the trenches 150, and finally FIG. 1(i) shows the metallic layer and remaining portions of the second hard mask layer 112 having been removed by a CMP to form interconnecting wires 160 imbedded within the dielectric layer 110.

As evident from these figures, in the process used in the current art, the inter-level dielectric layer cannot avoid being directly exposed to an etching process. Particularly in the step of FIG. 1(g), an etching is directly performed on the dielectric layer 110 to form trenches 150 therein. The problem for such a process is that when a low k dielectric material is used for the dielectric layer 110, the etching gas, the plasma, would chemically interact with the surface of the low k dielectrics within the trenches, thereby changing the dielectric constant of it. The low k dielectric becomes seriously damaged from the etching, which would destroy all the benefits of improved time delay RC and reliability of performance for using a low k material.

In the process disclosed in the present disclosure herein, such a low k damage problem is eliminated. Further, as can be seen from in FIGS. 1(a)-(f), the process practiced in the current art uses two depositions and two etching steps in forming spacers. By contrast, the process of the present disclosure employs, for forming the spacer, just one step of deposition of the in-situ plasma gases within the etching chamber as the spacer material, and one etching step, and thereby greatly reduces process time and production cost. Further, the process of the present disclosure dispenses with the need to use two hard masks that are used in the old practice in the art, as shown in FIGS. 1(a)-(i).

Figure 2:
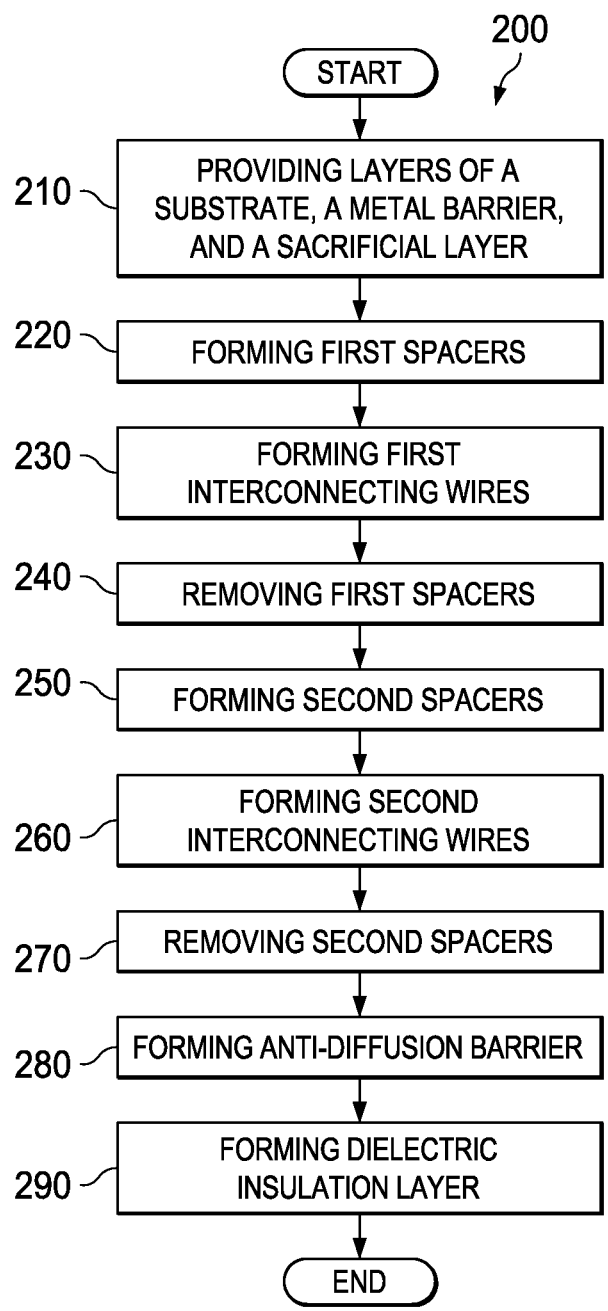
FIG. 2 is a flowchart of a process for forming interconnecting wires and insulations performed as a part of fabrication of semiconductor devices in accordance with aspects of the present disclosure.

FIG. 2 is a flowchart of a process 200 for forming interconnecting wires and insulations therebetween as a part of fabrication of semiconductor devices in accordance with aspects of the present disclosure. FIGS. 3(a)-(k) are schematic diagrams illustrating the process 200 of FIG. 2 in accordance with aspects of the present disclosure. Although there may be several layers of interconnecting wires in an actual semiconductor chip, FIG. 2 and FIGS. 3(a)-(k) describe the process performed to construct a single level of interconnecting wires, which has been provided herein only as one example. The process to form multi-levels of interconnecting wires will be essentially the repetition of a similar process described herein through FIG. 2 and FIGS. 3(a)-(k).

Figure 3A:
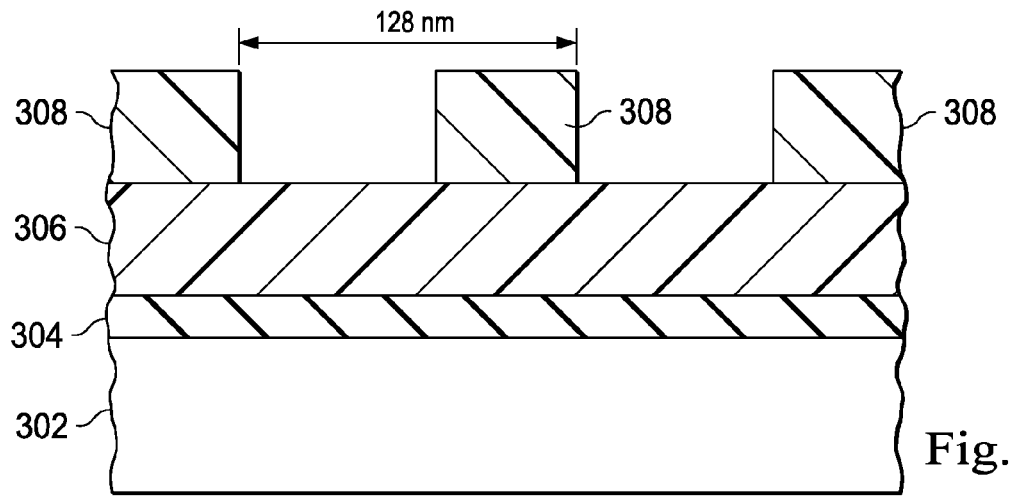
FIGS. 3(a)-(k) are schematic diagrams of a process for forming interconnecting wires and insulations performed as a part of fabrication of semiconductor devices in accordance with aspects of the present disclosure.

At step 210, a stack of layer comprising, successively, a substrate, a metal barrier layer, and a sacrificial layer is provided. In this disclosure, the word, provision, is used in a broad sense to encompass any means of acquiring so structured layer stack, which may include, but is not limited to, fabrication of the layer stack or preparation of a prefabricated one. FIG. 3(a) shows a schematic cross-sectional view of such a layer stack comprising a substrate 302, an etch stop layer 304, and a sacrificial layer 306 formed or provided according to one aspect of the present disclosure.

In the present disclosure, the substrate 302 is not limited to the conventional narrowly meant substrate, which is typically comprised of a single semiconducting material such as silicon and used for supporting semiconductor devices, but may encompass broad ranged structures. In one embodiment, the substrate 302 may be an interlevel dielectric layer separating the layers of interconnections. In this case, there may be other levels of interconnecting wires already formed below the substrate 302, and thus, the level of interconnecting wires to be formed through the steps of FIGS. 3(a)-(k) may be in fact the second, third, or higher level of interconnecting wires. In another embodiment, the substrate 302 itself may contain a finished semiconductor devices such as MOSFET, a layer of phosphor-silicate glass (PSG) covering the devices, and/or a seal layer of silicon carbide (SIC). It may further include contacts made of tungsten or vias, by which the interconnecting wires formed on the substrate 302 may be connected to the interconnecting wires of other levels or semiconductor devices below.

If the substrate 302 is the conventional layer supporting semiconductor devices, it may comprise, in one embodiment, silicon in a crystalline structure. Alternatively, it may comprise other suitable elementary semiconductors, such as germanium in crystal; a compound semiconductor, such as silicon carbide, gallium arsenic, gallium phosphide, indium phosphide, indium arsenide, and/or indium antimonide; or combinations thereof. The substrate 302 may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Alternatively, the substrate 302 may further include another semiconductor layer on top of an insulator layer to form a silicon-on-insulator (SOI) substrate, which can be fabricated using wafer bonding, and/or other suitable methods. The substrate 302 may comprise any suitable crystallographic orientation (e.g., a (100), (110), (111), or (001) crystallographic orientation).

The substrate 302 may include various doped regions formed by an implantation process depending on design requirements as known in the art (e.g., p-type wells or n-type wells). The doped regions are doped with p-type dopants, such as boron or BF2; n-type dopants, such as phosphorus or arsenic; or combinations thereof. The doped regions may be formed directly on the substrate 302, in a P-well structure, in a N-well structure, in a dual-well structure, or using a raised structure. The semiconductor substrate 302 may further include various active regions, such as regions configured for an N-type metal-oxide-semiconductor transistor device and regions configured for a P-type metal-oxide-semiconductor transistor device.

The etch stop layer 304 formed upon the substrate 302 is used essentially for two purposes, one for preventing the copper interconnecting wires, which will be formed thereon, from diffusing into the dielectric material of the substrate 302 below, and the other, for stopping the etchings to be performed to the various layers above during the process 200 at the level of the etch stop layer 304. The etch stop layer 304 may be any non-conducting material to serve those purposes, such as titanium nitride (TiN), tantalum nitride (TaN), tungsten nitride (WN), titanium silicon nitride (TiSiN) or tantalum silicon nitride (TaSiN), silicon carbide (SiC), silicon nitride (SiN), NDC (nitrogen doped carbide), or ODC (oxygen doped carbide).

The sacrificial layer 306 is formed on top of the etch stop layer 304. This layer is called a sacrificial layer because it will be used to form an intermediate spacer for the copper interconnecting wires and be eventually removed thereafter. In one embodiment, the material for this layer is a polymer, such as polyimide ("PI"), polypropylene, or fluoroacrylate-type polymer, which is commonly used for the benefits of cheaper fabrication, lower processing temperatures and wider range of material properties. The polymer layer 306 may be deposited by spin-coating, and go through the processes of flood exposure to UV light to initiate cross-linking, and curing at higher temperature.

In another embodiment, the sacrificial layer 306 may be the usual hard mask layer. Such a hard mask layer may comprise any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material, and it may be formed by any suitable process.

At step 220, a plurality of substantially equal-spaced first spacers are formed out of the polymer layer 306 by any suitable process known in the art, including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as mask-less photolithography, electron-beam writing, and ion-beam writing.

More particularly, a photoresist ("PR") layer is coated upon the polymer layer 306 for patterning. The photoresist may be any suitable material used in the art, such as Poly (methyl methacrylate) (PMMA), Poly (methyl glutarimide) (PMGI), Phenol formaldehyde resin (DNQ/Novolac), SU-8, and may be either positive or negative photoresist. These materials are all applied as a liquid and, generally, spin-coated to ensure uniformity of thickness. After prebaking, the photoresist layer is exposed to an ultraviolet (UV), deep ultraviolet (DUV) or electron beam through a pattern via a photomask. The exposure to light causes a chemical change that allows some of the photoresist to be removed by a special solution, called "developer" by analogy with photographic developer. For positive photoresist, the most common type, the exposed part becomes soluble in the developer. After going through a post-exposure baking process, the remaining (unexposed) parts form a mask that resists etching. FIG. 3(a) shows such photoresist masks 308 after the exposure, developing, and post-exposure baking process. In the embodiment shown in FIG. 3(a), the masks 308 are patterned to be equal spaced, having a pitch of 128 nanometer ("nm"), and a width of 48 nm for each.

Next, an etching is performed upon the polymer layer 306 to remove the areas thereof that are not protected by photoresist masks 308. The etching stops at the etch stop layer 304. Any known etching processes may be used, such as wet etching, dry etching, or plasma etching, but when an anisotropic etching is desired, a plasma etching may be used. In one embodiment, etching the polymer may use a mixture of process gases. For instance, oxygen and tetrafluoromethane (CF4), when mixed together for use in plasma etching, create the oxyfluoride ion (OF—). The oxyfluoride ion is a powerful etching agent for polymeric substances. This ion is particularly adept at cutting the carbon-carbon molecular bonds in the polymer backbone and removing the molecule quickly. The etchants that may be used for polymer etching may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$.

Figure 3B:
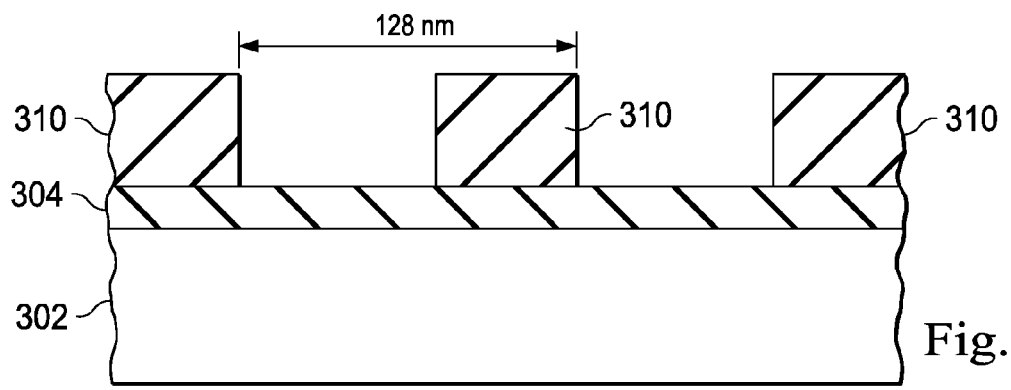

After etching portions of the polymer layer 306, the photoresist masks 308, which are no longer needed, are removed by a process called ashing. This usually requires a liquid "resist stripper", which chemically alters the resist so that it no longer adheres to the polymer layer 306. Alternatively, the photoresist masks 308 may be removed by a plasma containing oxygen, which oxidizes it. FIG. 3(b) shows the remaining portions of the polymer layer 306, which form the substantially equal-spaced first spacers 310 after the etching and ashing processes. In the particular embodiment illustrated, the equal-spaced first spacers 310 would have a pitch of 128 nm, and a width of 48 nm in accordance with the pitch and width of the photoresist masks 308.

Figure 3C:
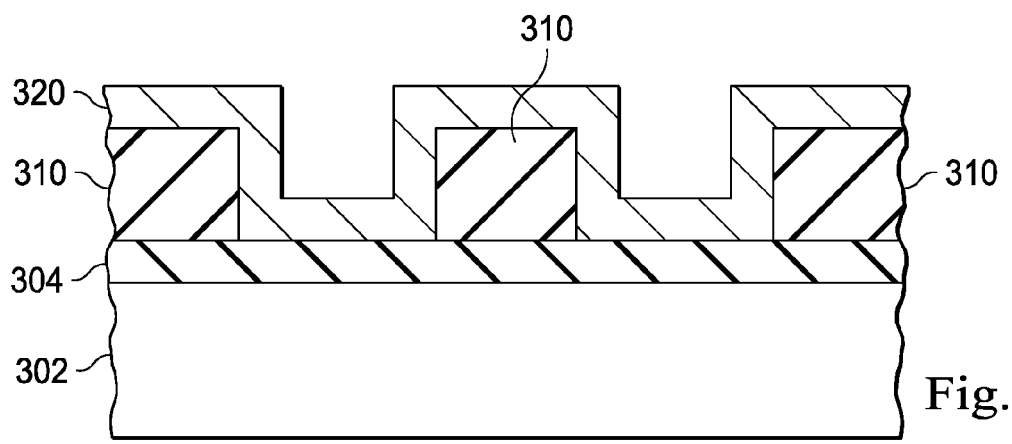
Figure 3D:
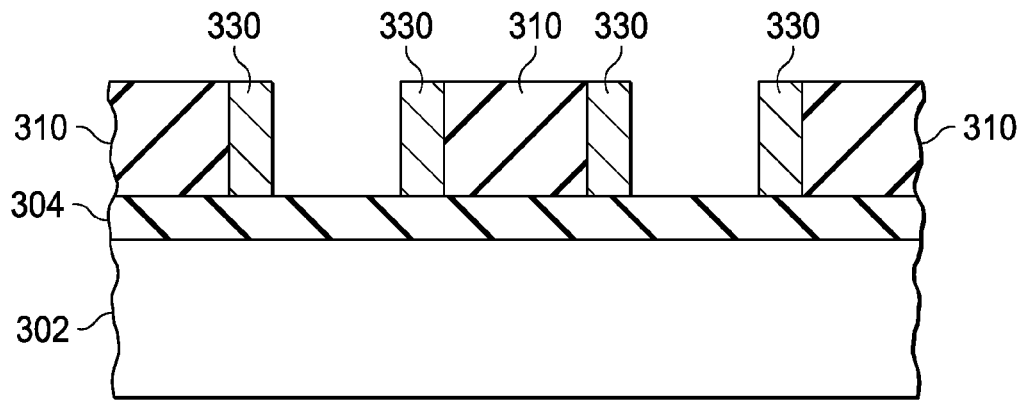
Figure 3E:
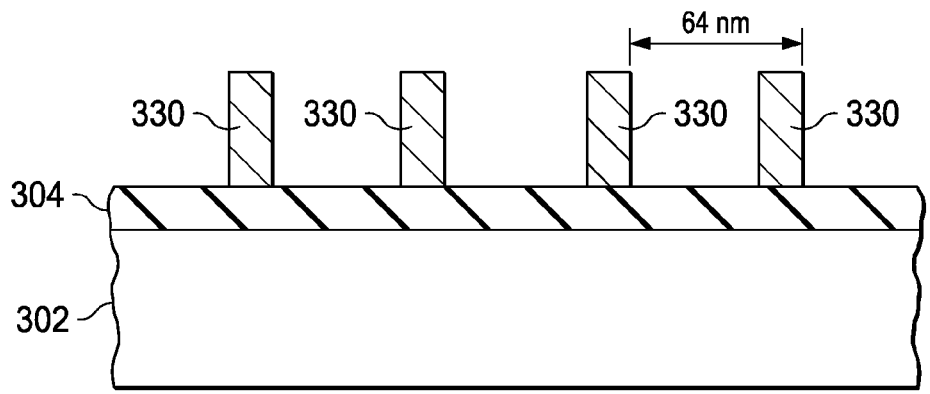

At step 230, schematically illustrated in FIGS. 3(c)-(e), a plurality of substantially equal-spaced metal interconnecting wires are formed. In an embodiment, copper is used for the metal interconnecting wires. First, copper is deposited upon the first spacers 310 and the etch stop layer 304 to form a first interconnection copper layer 320 as shown in FIG. 3(c). The copper layer 320 may be formed, in an embodiment, by a plasma-enhanced chemical vapor deposition (PECVD), a process used to deposit thin films from a gas state (vapor) to a solid state on a substrate. Chemical reactions are involved in the process, which occur after creation of a plasma of the reacting gases. The plasma is generally created by RF (AC) frequency or DC discharge between two electrodes, the space between which is filled with the reacting gases. PECVD is often used for depositing films or layers conformally (covering sidewalls) and yields some of the fastest deposition rates while maintaining film quality (such as roughness, defects/voids), as compared with sputter deposition and thermal/electron-beam evaporation, often at the expense of uniformity. The copper layer 320, however, may be deposited by any other known epitaxial growth process, including chemical vapor deposition (CVD), physical vapor deposition (PVD), molecular beam epitaxy (MBE), high density plasma CVD (HDPCVD), metal organic CVD (MOCVD), remote plasma CVD (RPCVD), Electro-less deposition, plating, or any suitable processes known in the art and/or combinations thereof. Such an epitaxy process may use either gaseous and/or liquid precursors.

After the copper layer 320 is formed, the portions of the copper layer 320 that are right above the first spacers 310 and some portions on the etch stop layer 304 are partially removed by an etching process, leaving only portions abutting two opposing sides of each of the first spacers 310 as shown FIG. 3(d). These remaining portions form the first copper interconnecting wires 330 when the first spacers 310 are subsequently removed. In one embodiment, for defining sharp edges and obtaining controlled width of the first copper interconnecting wires 330, an anisotropic etching, such as the plasma or dry etching process, may be used. The etchants may be any one that is known in the art such as $Cl_2$, $CCl_4$, $SiCl_2$, $BCl_3$, $CCl_2F_2$, $CF_4$, $SF_6$, or $NF_3$. In the particular embodiment shown in FIG. 3(d), the anisotropic etching may control the first copper interconnecting wires 330 to have a common width of 16 nm. Such a control in the width will end up with all copper interconnecting wires 330 having a single value of a pitch, 64 nm, as shown in FIG. 3(e).

Once the first copper interconnecting wires 330 are formed by the partial etching, then at step 240, the first spacers 310 made of polymer are removed by another etching process, leaving only the first copper interconnecting wires 330 as shown in FIG. 3(e). Again, the etching is stopped by the etch stop layer 304. The etching process used here may either wet etching or dry etching. But when the plasma etching is used, the etchant should be different from that used in the partial etching of the copper illustrated in FIG. 3(d) so that the first copper interconnecting wires 330 may not be affected.

Figure 3F:
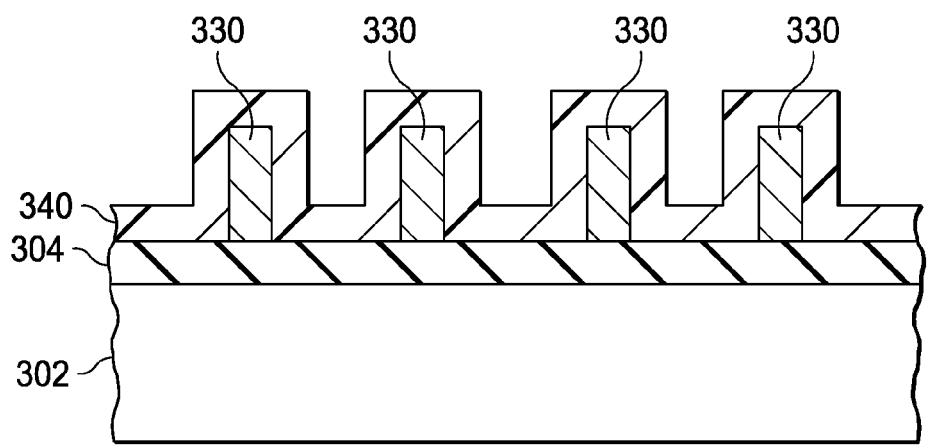
Figure 3G:
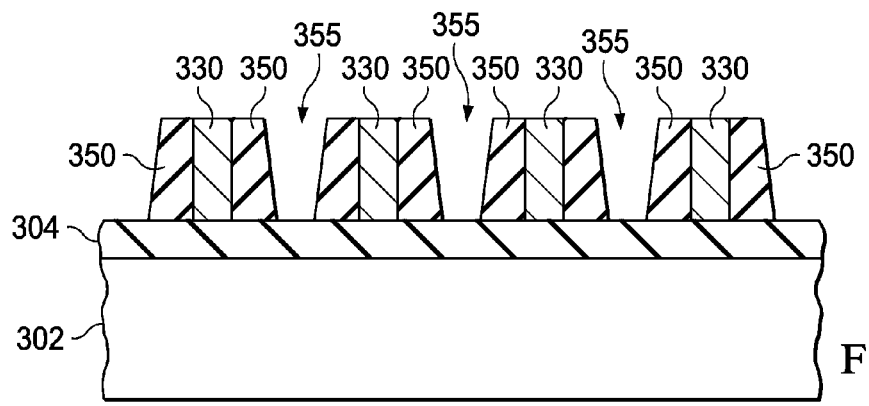

Now at step 250, schematically illustrated in FIGS. 3(f)-(g), a plurality of substantially equal-spaced second spacers are formed. For that, a plasma gas is deposited upon the first copper interconnecting wires 330 and the etch stop layer 304. In one embodiment, the deposited plasma gas is $CH_2F_2$ or $CH_4$, the etching gas used for the plasma etching. The deposition may be performed in an etching chamber by using, for instance, PECVD. Once deposited, the plasma gas will form a carbon hydrogen, polymer-like film 340, typically of thickness in the order of ~20 nm, around the first copper interconnecting wires 330 as shown in FIG. 3(f). The instant process is more advantageous over the prior methods in the art that use oxide material for constructing spacers, which require steps of depositing oxides and etching them in a separate chamber. By contrast, the process in the current disclosure, depicted in FIGS. 3(f)-(g), can be performed in the same chamber where plasma etching is performed, just with changing the type of plasma gas to, for example, $CH_2F_2$ or $CH_4$, and making some necessary adjustment of parameters in the chamber for converting the etching process to a deposition process.

The second spacers 350 are formed by partially etching partially removing the polymer-like film 340 as shown in FIG. 3(g). The etching may be performed, in an embodiment, in the same etching chamber where the deposition of the plasma gas was made in FIG. 3(f) by changing necessary parameters to convert from a deposition mode to an etching mode. In an embodiment, an anisotropic plasma etching is used to partially remove portions of the polymer-like film 340 right above the first copper interconnecting wires 330 and the portions above the etch stop layer 304, while leaving portions 350 abutting two opposing sides of the first copper interconnecting wires 330, and defining a plurality of trenches 355 between the remaining portions 350 as shown in FIG. 3(g). The remaining portions 350 of the polymer-like film 340 act as the second spacers 350 for constructing the second copper interconnecting wires in the next step.

The anisotropic etching may be performed to control the widths of the second spacers 350 and the trenches 355. In the embodiment shown in FIGS. 3(g)-(h), in order to have a uniform pitch and width for the copper interconnecting wires that are to be formed, the widths of the second spacers 350 and the trenches 355 may be set to be 16 nm each, the width of the first copper interconnecting wires 330. In another embodiment, however, the widths of the second spacers 350 and the trenches 355 may have different values if desired. In that case, there would be two sets of interwoven copper interconnecting wires, each having different widths.

In one embodiment, the anisotropic etching may be performed in a way to form the trenches 355 in a wedged shape that has a wider opening at the top than at the bottom as shown in FIG. 3(g). This particular shape will produce arrays of the copper interconnecting wires of the same shape, which will be formed within the trenches. And such a particular shape of the etched trenches in the process of the present disclosure may have an advantage of eliminating the chronic metal gap fill issue in the art in forming the metal interconnecting wires because owing to the wider opening at the top than the bottom of a trench, it is much easier to fill it with metal all the way down to the bottom as compared to the straight-walled trenches typically formed in the dielectric material in the prior art.

At step 260, a plurality of second copper interconnecting wires is formed. Just like the step for forming the first copper interconnecting wires 330, copper is deposited upon the first copper interconnecting wires 330 and the second spacers 350, and into the trenches 355 to form a copper layer. The copper layer may be formed by any epitaxial growth process known in the art, including chemical vapor deposition (CVD), physical vapor deposition (PVD), molecular beam epitaxy (MBE), high density plasma CVD (HDPCVD), metal organic CVD (MOCVD), remote plasma CVD (RPCVD), plasma enhanced CVD (PECVD), Electro-less deposition, plating, or any suitable processes known in the art and/or combinations thereof. The epitaxy process may use either gaseous and/or liquid precursors.

Figure 3H:
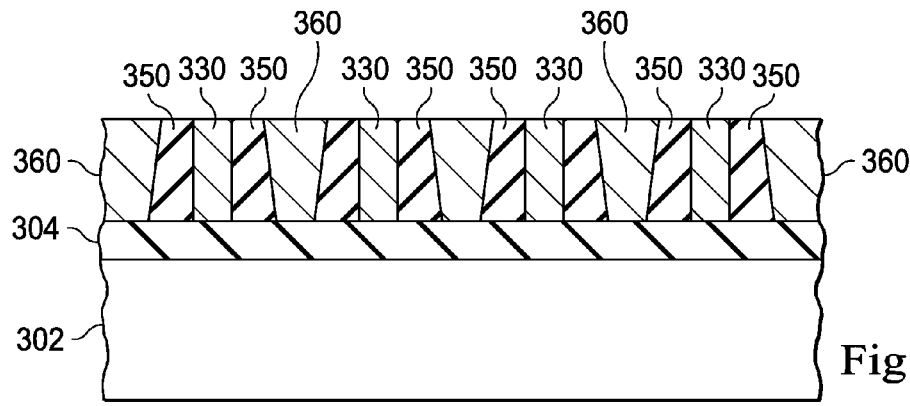

After the deposition, the copper layer is partially removed to the level of the top planes of the first copper interconnecting wires 330, the second spacers 350, and the trenches 355, as shown in FIG. 3(h), by the process of Chemical Mechanical Polishing/Planarization ("CMP"), a process of smoothing surfaces with the combination of chemical and mechanical forces. In the latest 65 nm technology, CMP process can remove and planarize a surface even to the Angstrom levels.

Now. After the CMP process, what remain from the second deposited copper are only those filling the trenches 355, which form the second copper interconnecting wires 360.

Figure 3I:
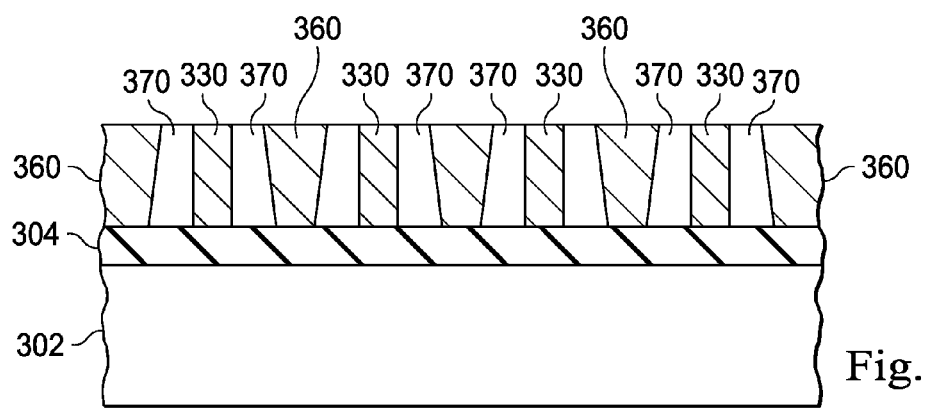

At step 270, the second spacers 350 are removed by an etching process. Any known etching process including wet etching, dry etching, or plasma etching may be used with wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$. The removal of the second spacers 350 will define a plurality of substantially equal-spaced channels 370, as shown in FIG. 3(i), having the shape of the second spacers 350 and being interwoven with the alternating first and second metal interconnecting wires 330 and 360. In the particular embodiment shown in FIG. 3, the pitch of the copper interconnecting wires, the interval between two neighboring first and second interconnecting wires that are alternating, would be 36 nm, while the widths of the first and second metal interconnecting wires 330 and 360 and the channels 370 would be all 16 nm each.

Figure 3J:
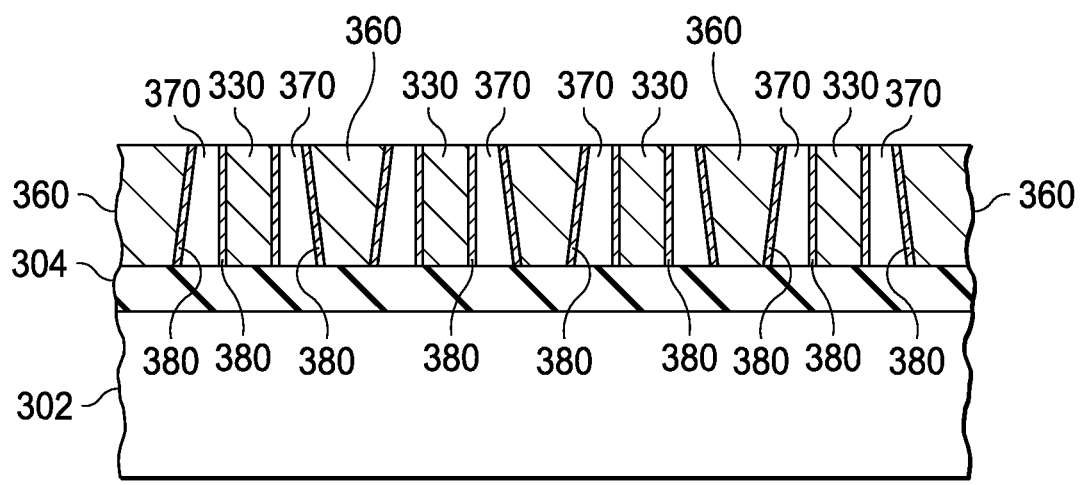

Now at step 280, an anti-diffusion barrier film 380 is formed around each of the first and second copper interconnecting wires 330 and 360 as shown in FIG. 3(j). Metal barriers are used to avoid diffusion of the copper into the surrounding materials such as the insulating dielectric material to be filled in the channels 370 at step 290, and the substrate 302. They also prevent copper contamination by elements diffusing from the insulators. The barrier metal film 380 must completely surround all copper interconnections to prevent the degradation of the insulating dielectric material to be filled between the copper interconnecting wires 330 and 360. The metal barriers have strict demands: they should be pure; dense; conductive; conformal; thin; have good adhesion towards metals and insulators. Commonly used barrier metals are transition-metal nitrides, such as titanium nitride (TiN), tantalum nitride (TaN), tungsten nitride (WN), titanium silicon nitride (TiSiN) or tantalum silicon nitride (TaSiN).

The thickness of the barrier film 380 should be well controlled because if it is too thin, the diffused copper would poison the very devices that they connect to, and if it is too thick, the stack of two barrier metal films and a copper interconnect would result in a greater total resistance than aluminum interconnecting wires, eliminating the benefit of replacing aluminum that does not require barrier metals on the sides of the interconnecting wires lines. In one embodiment, the anti-diffusion barrier film 380 may be formed by atomic layer deposition (ALD), a thin film deposition technique based on the sequential use of a gas phase chemical process. The majority of ALD reactions use two chemicals, typically called precursors, which react with a surface one at a time in a sequential manner. By exposing the precursors to the growth surface repeatedly, a thin film is deposited. The modern technique of ALD film growth makes possible atomic scale deposition control, as fine as ~0.1 Å (10 pm) per cycle.

After forming the barrier film 380, then at step 290, a dielectric material is deposited to fill the channels 370 to form an insulation layer 390 between the first and second copper interconnecting wires 330 and 360. In one embodiment, the dielectric material may be low k (dielectric constant) material, having k value less than 3, such as fluorinated silica glass (FSG, k=2.8), hydrogen silsesquioxane (HSQ, k=2.9), carbon doped silicon oxide, amorphous fluorinated carbon (k=2.0), Parylene (k=2.4-2.7), B-stage polymers (k=2.6), BCB (bis-benzocyclobutenes), PTFE (Teflon, k=1.9), SiLK (Dow Chemical, Midland, Mich.), SiOC (silicon oxycarbide) polymers (k=2.0), polyimides/Fluorinated (k=2.9/2.3), Poly (arylene ether) PAE (k=2.6). In another embodiment, the dielectric material may be an ultra-low k dielectric material including a porous version of an existing dielectric material, such as Porous MSQ (k=1.8), Porous PAE (k=1.8), Porous SiLK (k=1.5), and Porous $SiO_2$ (k=1.1). In still another embodiment, the dielectric material may be the typical undoped and doped silicon dioxide (SiO2), silicon oxynitride (SiON), and silicon nitride (Si3N4), or other high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN).

Figure 3K:
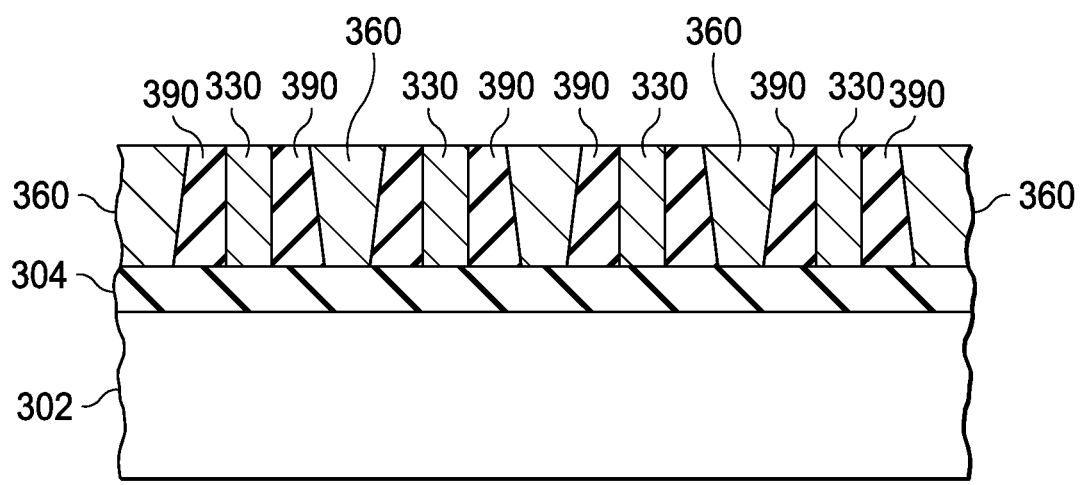

At this step 290, first, the low k dielectric material may be deposited by spin-on coating or spin-on dielectric (SOD) process, CVD, or any other suitable deposition processes upon the first and second copper interconnecting wires 330 and 360 and the channels 370. After the deposition, the upper portions of deposited dielectric layer may be removed by, in an embodiment, a CMP process to the level of the top planes of the first and second copper interconnecting wires 330 and 360, and the channels 370, as shown in FIG. 3(k), completing the process 200 of forming one layer of copper interconnecting wires of a given semiconductor device.

The method of forming interconnecting wires in the fabrication of semiconductor devices according to the present disclosure provides a variety of advantages over the methods practiced in the prior art. First, the present process avoids the problem of low k dielectric material damage that follows the conventional way, in which trenches are formed first in a dielectric layer by an etching process and then filled by copper to form interconnection wires. In the instant process, the dielectric insulation is formed only in the last stage, after formation of all interconnection wires that involve several etching processes, and therefore, is never exposed to any etching process that may degrade its properties. The instant process enables enjoyment of all the benefits in using low k dielectric material as the interconnection insulation without the hectic problem of degradation, and thereby achieves improvement in RC time delay and reliability performance of the device. Second, the present process needs only a single spacer deposition process, as contrasted by two in the methods of the prior art, and saves fabrication time and cost by the reduced number of steps. The instant process further saves fabrication cost by using in-situ plasma gas in an etching chamber, instead of conventional silicon oxides, as a spacer material. Also, in the present process, the metal gap fill issue is also avoided by filling copper into wedge-shaped trenches formed by anisotropic etching as described herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a plurality of substantially equal-spaced first spacers having a first pitch over a substrate;
   forming a plurality of substantially equal-spaced first metal interconnecting wires having a second pitch by utilizing the first spacers;

forming a plurality of substantially equal-spaced second spacers in such a way to abut, respectively, the plurality of first metal interconnecting wires and define a plurality of substantially equal-spaced trenches alternatingly located among the first metal interconnecting wires and bounded by the second spacers;

forming a plurality of second metal interconnecting wires disposed, respectively, within the trenches;

removing the second spacers, thereby defining thereat a plurality of substantially equal-spaced channels; and forming dielectric insulation layers within the channels.

2. The method claim 1, wherein the metal for the first and second metal interconnecting wires is copper and wherein the second pitch is half of the first pitch.

3. The method claim 1, wherein the dielectric insulating layers include a material having a dielectric constant equal or smaller than 3.0.

4. The method claim 1, wherein forming a plurality of substantially equal-spaced first spacers comprises:

exposing and developing a photoresist layer to form a plurality of substantially equal-spaced masks having the first pitch upon the sacrificial layer;

removing parts of the sacrificial layer that are not protected by the masks; and removing the masks.

5. The method claim 1, wherein forming a plurality of substantially equal-spaced first metal interconnecting wires comprises:

depositing interconnection metal upon the first spacers to form a first interconnection metal layer; and partially removing the first interconnection metal layer in such a way to form the first metal interconnecting wires.

6. The method claim 5, wherein the first interconnection metal layer is partially removed by a plasma etching.

7. The method claim 1, wherein forming the first interconnecting wires and forming the second interconnecting wires use at least one process from the group consisting of PVD (physical vaporization deposition), CVD (chemical vaporization deposition), and Electro-less deposition.

8. The method claim 1, wherein forming a plurality of substantially equal-spaced second spacers comprises:

depositing a plasma gas upon the first copper interconnecting wires to form a polymer-like film; and partially removing the polymer-like film in such a way to form the second spacers and the trenches.

9. The method claim 8, wherein the plasma gas is $CH_2F_2$ or $CH_4$ and deposited within an etching chamber.

10. The method claim 1, wherein each of the trenches has a wider opening at a top than at a bottom thereof.

11. The method claim 1, wherein forming a plurality of second metal interconnecting wires comprises:

depositing interconnection metal upon the second spacers and the first metal interconnecting wires and into the trenches to form a second interconnection metal layer; and partially removing the second interconnection metal layer in such a way to form the second metal interconnecting wires.

12. The method claim 11, wherein the second interconnection metal layer is partially removed by a process of chemical mechanical planarization (CMP).

13. The method claim 1, wherein the anti-diffusion barrier is formed by a process of ALD (atomic layer deposition).

14. The method claim 1, wherein forming dielectric insulation layers comprises:

depositing dielectric material upon the first and the second metal interconnecting wires and into the channels; and partially removing the dielectric material in such a way to form the insulation layers.

15. The method claim 14, wherein the dielectric material is deposited by a process of CVD (chemical vaporization deposition), or SOD (spin-on deposition).

16. A method of forming interconnecting wires during fabrication of a semiconductor device, the method comprising:

forming a plurality of substantially equal-spaced and parallel first metal interconnecting wires upon a substrate;

forming a plurality of substantially equal-spaced and parallel second metal interconnecting wires upon the substrate, the second metal interconnecting wires being alternatingly formed among the first metal interconnecting wires in such a way to define a plurality of substantially equal-spaced channels between the alternating first and second interconnecting wires;

forming an anti-diffusion barrier film such that it wraps each of the first and the second metal interconnecting wires; and filling a dielectric material into the channels, wherein the first and the second metal interconnecting wires have different cross-sectional configurations.

17. The method of claim 16, wherein the metal for the first and the second metal interconnecting wires is copper.

18. The method of claim 16, wherein the dielectric material has a dielectric constant equal or smaller than 3.0.

19. A method of forming interconnecting wires during fabrication of a semiconductor device, the method comprising:

providing a stack of layers comprising a substrate, an etch stop layer formed upon the substrate, and a sacrificial layer formed upon the etch stop layer;

forming a plurality of substantially equal-spaced first spacers;

forming a plurality of substantially equal-spaced first metal interconnecting wires by utilizing the first spacers;

forming a plurality of substantially equal-spaced polymer-like second spacers in such a way to abut, respectively, the plurality of first metal interconnecting wires and define a plurality of substantially equal-spaced trenches alternatingly located among the first metal interconnecting wires and bounded by the second spacers;

removing the first spacers;

forming a plurality of second metal interconnecting wires disposed, respectively, within the trenches; and removing the second spacers, thereby defining a plurality of substantially equal-spaced channels interwoven with the alternating first and second metal interconnecting wires.

20. The method of claim 19, further comprising forming an anti-diffusion barrier film over the first and the second metal interconnecting wires.

* * * * *